United States Patent
Dye et al.

(10) Patent No.: US 7,326,469 B2
(45) Date of Patent: Feb. 5, 2008

(54) COATING SYSTEM AND PROCESS AND APPARATUS FOR DEPOSITING A COATING SYSTEM

(75) Inventors: David Forrest Dye, Cincinnati, OH (US); John Frederick Ackerman, Laramie, WY (US); Bhupendra Kumar Gupta, Cincinnati, OH (US); Jennifer Ann Pinson, Newton, MA (US); Brian Thomas Pothier, Beverly, MA (US); Anthony Wayne Reynolds, Burlington, KY (US)

(73) Assignee: General Electric Company, Schenectady, NY (US)

( * ) Notice: Subject to any disclaimer, the term of this patent is extended or adjusted under 35 U.S.C. 154(b) by 195 days.

(21) Appl. No.: 10/907,845

(22) Filed: Apr. 18, 2005

(65) Prior Publication Data

US 2006/0056976 A1    Mar. 16, 2006

Related U.S. Application Data

(63) Continuation-in-part of application No. 10/711,403, filed on Sep. 16, 2004, now Pat. No. 6,808,816.

(51) Int. Cl.
*B32B 15/04* (2006.01)
*B32B 18/00* (2006.01)

(52) U.S. Cl. ............... 428/448; 428/450; 428/469; 428/701; 428/699; 428/632; 416/241 R; 416/241 B; 422/241

(58) Field of Classification Search ............ 416/241 B, 416/241 R; 428/446, 448, 450, 469, 472, 428/670, 697, 699, 701, 702; 422/241
See application file for complete search history.

(56) References Cited

U.S. PATENT DOCUMENTS 5,090,985 A    2/1992    Soubeyrand et al.

(Continued)

FOREIGN PATENT DOCUMENTS

| EP | 0304176 A2 | * | 2/1989 |
| EP | 1398079 A2 | * | 3/2004 |
| JP | 56030514 A | * | 3/1981 |

OTHER PUBLICATIONS

Masahiko Matsumiya, Woosuck Shin, Noriya Iza, and Norimitsu Murayama; "Nano-structured thin-film Pt catalyst for thermoelectric hydrogen gas sensor"; Sensors and Actuators B, Elsevier Sequoia S.A., Lausanne, CH; vol. 93, No. 1-3; Aug. 1, 2003, pp. 309-315.

*Primary Examiner*—John J. Zimmerman
*Assistant Examiner*—Aaron Austin
(74) *Attorney, Agent, or Firm*—William Scott Andes; Gary M. Hartman; Domenica N. S. Hartman

(57) ABSTRACT

A coating system for reducing the tendency for hydrocarbon fluids, such as fuels and oils, to form carbonaceous deposits that adhere to fluid containment surfaces. The coating system combines an outermost layer of platinum with an inner ceramic barrier layer of silica and/or tantala. The platinum layer catalyzes the hydrocarbon fluid to form particles of carbonaceous gum substances, and the ceramic barrier layer seals the containment surface from the hydrocarbon fluid to eliminate attachments points for deposits and inhibit inter-diffusion between the platinum layer and the containment surface. The invention also encompasses a coating apparatus and process for depositing the coating system.

20 Claims, 2 Drawing Sheets

U.S. PATENT DOCUMENTS

| | | |
|---|---|---|
| 5,393,564 A | 2/1995 | Westmoreland et al. |
| 5,505,781 A | 4/1996 | Omori et al. |
| 5,891,584 A * | 4/1999 | Coffinberry ................. 428/552 |
| 6,156,439 A | 12/2000 | Coffinberry |
| 6,265,026 B1 | 7/2001 | Wang |
| 6,548,112 B1 | 4/2003 | Hillman et al. |
| 6,572,706 B1 | 6/2003 | Nguyen et al. |
| 6,808,816 B2 * | 10/2004 | Mancini et al. ............. 428/469 |
| 2004/0053024 A1 * | 3/2004 | Mancini et al. ............. 428/216 |
| 2005/0019593 A1 | 1/2005 | Mancini et al. |

* cited by examiner

COATING SYSTEM AND PROCESS AND APPARATUS FOR DEPOSITING A COATING SYSTEM

BACKGROUND OF THE INVENTION

The present invention relates to coatings that inhibit the formation and adhesion of deposits on surfaces that contact hydrocarbon fluids, such as hydrocarbon fluid containment systems including but not limited to gas turbine engines, furnaces used to produce polymers, diesel engines, etc. More particularly, this invention relates to a coating system for preventing or reducing the deposition of carbonaceous deposits on the surfaces of fuel nozzles, swirlers, oil scavenge lines, and other fuel and lubrication system components of gas turbine engines, as well as a process and apparatus for depositing the coating system.

Thermal instability, or in the case of fuels, fuel instability, generally refers to the formation of undesired carbonaceous deposits that occurs when hydrocarbon fluids, such as fuels and lubricating oils, are at elevated temperatures. In the case of fuels, it is generally accepted that there are two distinct mechanisms occurring within two overlapping temperature ranges. In the first mechanism, referred to as the coking process, a generally consistent increase in the rate of formation of carbonaceous coke deposits occurs above temperatures of about 650° F. (about 345° C.). Coke formation is the result of high levels of hydrocarbon pyrolysis, and eventually limits the usefulness of the fuel. A second mechanism primarily occurs at lower temperatures, generally in the range of about 220° F. to about 650° F. (about 105° C. to about 345° C.), and involves oxidation reactions that lead to polymerization and carbonaceous gum deposits.

In the past, the solution to the problem of gum and coke formation was primarily directed toward placing limitations on fuel chemistry and impurities associated with fuels, as disclosed in U.S. Pat. Nos. 2,698,512, 2,959,915 and 3,173,247. However, the propensity for gum and coke formation is increased with certain hydrocarbon fluids for fuels, oils, lubricants, petrochemical processes (plastics and synthetics) and the like, especially those derived from nonpetroleum sources, such as shale and coal, which can exhibit significantly more problems with thermal instability because of their high content of olefins, sulfur and other compounds. The consequences of thermal instability and fuel instability are of even greater significance with developing technology that requires processes and machinery to operate at higher temperatures, as afforded by advances in materials technology. Accordingly, fluid containment articles that are resistant to or prevent the formation of adverse decomposition products and foulants are necessary in applications where thermal instability, including fuel instability, is a problem as a result of exposure of such fluids to high temperatures. Particularly notable applications include the fuel-handling and lubrication system components of gas turbine engines, which includes the fuel nozzles and swirlers that mix fuel and air before injecting the mixture into the combustor, oil scavenge lines that transport lubrication oil to critical bearings of the engine hot section, and bearing housings and seal runners that house the bearings requiring lubrication. With the advent of higher engine operation temperatures and the use of fuel as a heat sink, there is an increased likelihood that carbonaceous deposits can severely choke the flow of fuel and air through fuel nozzles and swirlers, affecting operating conditions (e.g., mixing of fuel and air, proper flow of fuel and oxygen into the combustor) and may reduce fuel efficiency and increase emissions. Higher engine operation temperatures also increase the likelihood that carbonaceous deposits will choke the flow of lubrication oil through scavenge lines, leading to loss of lubrication to critical bearings and flooding of the oil sump.

It has been recognized that deposits can form as a result of a reaction between a hydrocarbon fluid and its containment wall. In U.S. Pat. No. 4,078,604, heat exchangers are provided with thin-walled corrosion-resistant layers of electrodeposited gold or similar corrosion-resistant metals on the walls of the cooling channels in order to make the surfaces corrosion resistant to such storable liquid fuels as red fuming nitric acid. In this case, the wall is protected from corrosion, and the intent is not to prevent deposit formations. Furthermore, gold readily diffuses into other materials at elevated temperatures, and therefore is unsuitable as a protective coating for high temperature applications, e.g., temperatures associated with gum and coke formation.

More recently, coating systems specifically directed to inhibiting the formation and adhesion of carbonaceous deposits have been taught. For example, U.S. Pat. Nos. 5,805,973, 5,891,584, 5,923,944, and 6,156,439, all assigned to the assignee of the present invention and incorporated herein by reference, teach the use of coke barrier coatings (CBC's) that eliminate or modify the surface reactions which lead to formation of thermal instability deposits from hydrocarbon fluids, and reduce adhesion of such deposits. These patents are generally directed to ceramic coatings that are especially capable of reducing deposits at very high temperatures, e.g., above 650° F. (about 345° C.). As an example, U.S. Pat. Nos. 5,805,973 and 5,891,584 disclose coatings that catalyze thermal decomposition in the hydrocarbon fluid to actually promote the formation of coke, which is substantially nonadherent to the coatings.

Many applications exist where there is a particular need for coatings that can significantly reduce the formation and adhesion of carbonaceous deposits at lower temperatures, such as the above-noted 105 to 345° C. range for gum deposits. For this type of hardware, reductions in hydrocarbon deposits have been achieved with the use of coatings that are not reactive with hydrocarbons. In situations where heat transfer from the containment walls is a major contributor to the fluid temperature, thermally-reflective (low emissivity) coatings that reduce heat transfer to the hydrocarbon fluid have been employed to reduce deposit formation. Notably, the CBC systems taught by U.S. Pat. Nos. 5,805,973, 5,891,584, 5,923,944, and 6,156,439 do not have the correct optical properties, including low emissivity, to function as radiation shields. While CBC systems of the prior art can be combined with low-emissivity coatings, a significant drawback is the additional volume, weight and cost incurred.

Certain applications also exist where sustained temperatures result in the formation and adhesion of both coke and gum deposits, a particular example being fuel nozzles and swirlers whose sustained surface temperatures can be in the range of, for example, about 600 to 800° F. (about 315 to 425° C.). For such applications, it would be desirable if an improved coating system were available that was capable of reducing the formation and adhesion of both carbonaceous coke and gum deposits.

BRIEF SUMMARY OF THE INVENTION

The present invention provides a coating system for reducing the tendency for hydrocarbon fluids, such as fuels and oils, to form carbonaceous deposits that adhere to fluid containment surfaces. The invention is particularly concerned with carbonaceous gum and coke deposits that form at temperatures from about 600° F. (about 315° C.) to about 800° F. (about 425° C.). According to the invention, a coating system that combines an outermost layer of platinum with an inner ceramic barrier layer formed of silica and/or tantala has been shown to significantly reduce the formation of both gum and coke deposits within the above-noted 315° C. to 425° C. temperature range, as well as reduce the adhesion of such deposits. The coating system is deposited on a wall surface of the component contacted by the hydrocarbon fluid, such that the hydrocarbon fluid contacts and flows across the platinum outermost layer. The outermost layer serves to catalyze the hydrocarbon fluid to form particles of carbonaceous gum substances that are suspended within the hydrocarbon fluid. For this purpose, the outermost layer need only be a monolayer of platinum (several Angstroms in thickness) with a preferred thickness of about 30 to about 100 nm, though thicknesses of up to about 1000 nm are foreseeable. The ceramic barrier layer serves to seal the wall surface from the hydrocarbon fluid to eliminate attachments points for deposits, and also serves to inhibit interdiffusion between the outermost layer and the wall. For these reasons, the ceramic barrier layer has a thickness of at least 50 nm, more preferably at least 100 nm, with a preferred range of about 300 to about 1000 nm, though thicknesses of up to about 5000 nm are foreseeable.

From the above, it can be seen that the coating system of this invention can be present as a very thin coating system (slightly more than 100 nm), and therefore has negligible impact on weight and dimension of the components on which it is deposited. Yet at such thicknesses the coating system has been shown to reduce both gum and coke deposits in fuel and lubrication system components of gas turbine engines at temperatures previously avoided because of high coke production. As a result, the fuel and lubrication systems of a gas turbine engine are able to operate as intended with greatly reduced tendency for choking from coke formation.

The present invention also provides a chemical vapor deposition (CVD) process and apparatus suitable for depositing the coating system described above. The apparatus is simpler in construction and operation compared to comparable CVD coaters of the prior art, and makes possible a CVD process that more efficiently uses precursor material and improves coating uniformity.

The apparatus includes a coating chamber sized to accommodate a component to be coated by the apparatus, a device for heating an interior of the chamber, exterior tubing connected to the coating chamber for transporting a precursor material to the interior of the coating chamber, an evaporation tube connected to the exterior tubing and adapted to evaporate the precursor transported by the exterior tubing to the coating chamber, and a manifold located at an end of the evaporation tube so as to be suspended within the coating chamber. The evaporation tube extends through the interior of the coating chamber so as to be heated by the coating chamber, and the manifold has outlets through which precursor vapor within the evaporation tube enters the coating chamber to deposit and condense on the component.

The chemical vapor deposition process includes heating an interior of a coating chamber, delivering a nonvapor precursor material to an evaporation tube extending through the interior of the coating chamber so as to be heated by the coating chamber, evaporating the precursor within the evaporation tube to form a precursor vapor, introducing the precursor vapor into the coating chamber from the evaporation tube, and then depositing and condensing the precursor vapor on a component within the coating chamber to form a coating.

Other objects and advantages of this invention will be better appreciated from the following detailed description.

DETAILED DESCRIPTION OF THE INVENTION

Figure 1:
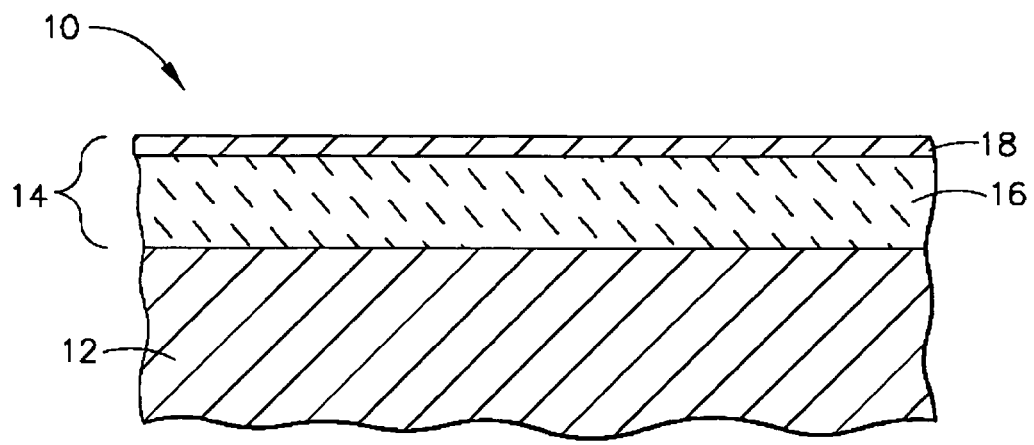
FIG. 1 represents a cross-sectional view of a hydrocarbon fluid containment wall having a coating system in accordance with this invention.

FIG. 1 represents a coating system 14 for a component 10 having a containment wall 12 that contacts a hydrocarbon fluid (e.g., fuels and oils) at elevated temperatures. The coating system 14 serves to prevent or at least significantly reduce the formation and adhesion of carbonaceous gum and coke deposits that would otherwise form and adhere to the wall 12 at temperatures in the range of about 600 to 800° F. (about 315 to 425° C.). The invention is applicable to any hydrocarbon fluid in which carbonaceous gum (or other polymers) deposits form when the fluid is subjected to elevated temperatures, such as about 105° C. to 345° C., and in which carbonaceous coke deposits form when the fluid is subjected to temperatures generally above 345° C. Such fluids may be pure hydrocarbon or mixtures thereof. Fluid containment articles that can benefit from the present invention may be any component which is adapted to contain or transport hot hydrocarbon fluid, and include but are not limited to fuel nozzles, swirlers, and oil scavenge pipes of gas turbine engines. With each of these examples, the containment walls of the component typically transfer heat from an external heat source to the hydrocarbon fluid within the component.

In the example represented in FIG. 1, a liquid hydrocarbon fluid (not shown) contacts and flows across the surface of the wall 12 protected by the coating system 14, such that heat transferred to the fluid from an external heat source must be conducted through the coating system 14. Accordingly, the wall 12 is protected by the coating system 14 which, in accordance with this invention, reduces or prevents the formation and adhesion of carbonaceous deposits from the fluid that tend to occur as a result of the elevated temperatures of the wall 12 and fluid. The wall 12 may generally be constructed of any suitable material for the particular application. Typical materials include stainless steel, corrosion-resistant alloys of nickel and chromium, and high-strength nickel-base alloys. Notably, alloys such as these that contain iron, chromium and nickel appear to cause or promote the formation of thermal decomposition products such as gum and coke in liquid hydrocarbon oils and fuels.

The coating system 14 of this invention includes a low-emissivity platinum layer 18 and a diffusion barrier layer 16 that separates the platinum layer 18 from the wall 12 of the component 10. Though shown as consisting of only two layers, it is foreseeable that additional coating layers could be employed. The coating system 14 is preferably continuous and completely covers all surfaces of the wall 12 that would otherwise contact the fluid.

In accordance with the present invention, the platinum layer 18 of the coating system 14 is smooth, reactive with hydrocarbon fluids at elevated temperatures, and exhibits low emissivity toward the hydrocarbon fluid contained by the wall 12. The platinum layer 18 exhibits sufficiently low emissivity so that radiation heat transfer to the hydrocarbon fluid is reduced. As such, the temperature of the fluid, and therefore the tendency for the fluid to form carbonaceous deposits, is reduced. Emissivity values ($\epsilon$) of about 0.2 or less are believed to be suitable for purposes of this invention. To promote a low emissivity, a preferred surface roughness for the platinum layer 18 is about 40 microinches (about 1.0 micrometer) $R_a$ or less. This aspect of the coating system 14 also reduces the amount of time that the bulk fluid has to react near the coating surface within the fluid boundary layer, reducing both surface reaction time and concentration of deposit precursors (radicals and atoms) that provide for polymer growth.

According to this invention, hydrocarbon fluid that eventually becomes sufficiently hot to form carbonaceous gum deposits is catalyzed by the platinum layer 18 to promote the rapid formation of gum substances. It is believed that the platinum layer 18 catalyzes the formation of carbonaceous gum substances in a hydrocarbon fluid to the extent that, in a flowing fluid system, the gum substances grow too quickly to allow them to adhere to the wall 12. Instead, gum substances are found in the form of very fine particulate within the fluid.

The thickness of the platinum layer 18 should generally take into account the growth properties of platinum as it is deposited, as well as the surface roughness of the wall 12. A suitable thickness for the platinum layer 18 is as little as a monolayer (a single layer of atoms), generally several Angstroms, with a preferred thickness of about 30 to about 100 nanometers. Greater thicknesses are also effective though cost becomes a factor with increasing thickness. In a preferred embodiment, the platinum layer 18 continuously covers the surface of the wall 12 to provide the desired chemical and reflective properties throughout the flow system where elevated wall and/or fluid temperatures are likely.

The diffusion barrier layer 16 prevents interdiffusion between the platinum layer 18 and the article wall 12, which would occur at an unacceptable rate at the temperatures of concern for the invention. In view of the extreme thinness of the platinum layer 18, the barrier layer 16 also protects the wall 12 from chemical attack from contaminants in the fluid, such as sulfur and water that would form sulfuric acid and pit the surface of the wall 12. Therefore, with the protective barrier layer 16, the coating system 14 prevents or inhibits reactions between constituents of the fluid and wall 12. Preferred materials for the barrier layer 16 are silica ($SiO_2$) and tantala ($Ta_2O_5$), and possibly mixtures of silica and tantala. As previously noted, the thickness of the barrier layer 16 must be sufficient to prevent interdiffusion with the material of the article wall 12. While optimal thicknesses will depend in part on the composition of the barrier layer 16, a minimum thickness is about 50 nanometers, with a more preferred range being about 300 to about 1000 nanometers, though thicknesses of up to about 5000 nm are foreseeable.

Figure 2:
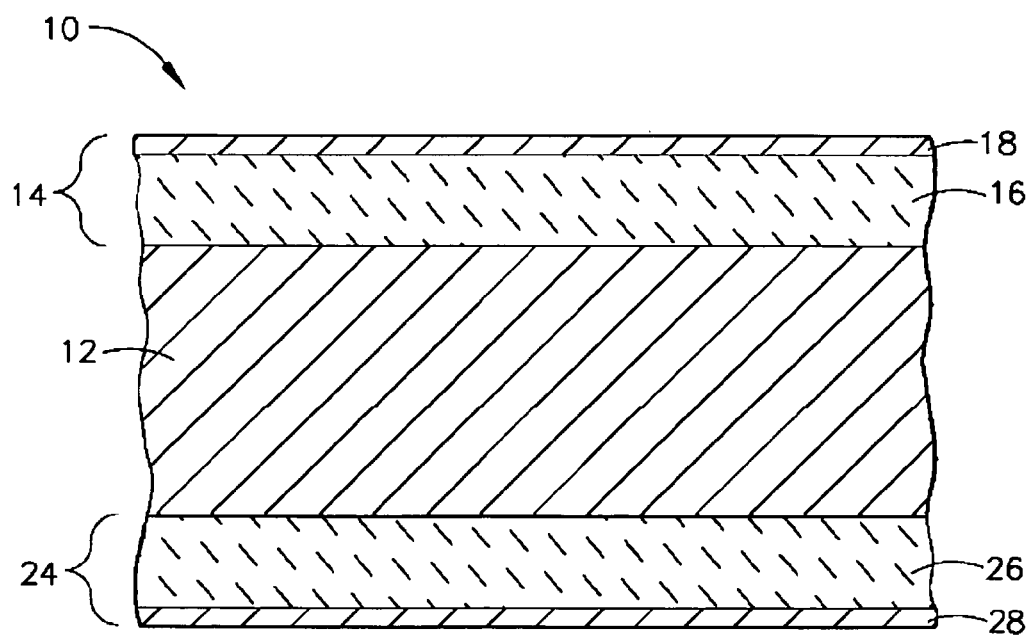
FIG. 2 represents a cross-sectional view of a hydrocarbon fluid containment wall having a coating system on a hydrocarbon-wetted surface of the wall and an oppositely-disposed surface of the wall in accordance with an alternative embodiment of this invention.

For applications where there is heat transfer through the component wall 12 between the hydrocarbon fluid and the environment (formed by a gas or a second fluid) contacting the wall surface opposite the surface protected by the coating system 14, it may also desirable to reduce the heat transfer and thus reduce the hydrocarbon-wetted surface temperature to further reduce deposition rates. In such applications, a second coating system 24 can also be deposited on the oppositely-disposed surface as shown in FIG. 2. The coating system 24 is preferably formed by the same layers and materials as that of the coating system 14, such that a platinum outermost layer 28 serves as a radiation shield to reduce heat transfer through the wall 12 to the hydrocarbon fluid and an underlying ceramic barrier layer 26 that prevents interdiffusion between the platinum layer 28 and the wall 12 and protects the wall 12 from chemical attack.

According to this invention, coatings having the above-described characteristics serve to prevent or at least considerably reduce the formation, deposition and adhesion of carbonaceous gum and coke deposits, as well as other potential decomposition impurities. As evident from the above, a requirement for the low-emissivity coating system 14 of this invention is for the barrier and platinum layers 16 and 18 to be deposited in such a manner as to obtain a suitable surface smoothness. According to the invention, a preferred deposition method is chemical vapor deposition (CVD), which is able to deposit the layers 16 and 18 on the wall 12 so that the surface finish of the coating system 14 replicates that of the underlying wall 12. In applications such as fuel nozzles, swirlers, and oil scavenge lines in which the surface to be coated is an interior surface, deposition by CVD is important as not being limited to line-of-sight deposition, enabling the barrier layer 16 and platinum layer 18 to be deposited on deep interior surfaces of the wall 12.

Figure 3:
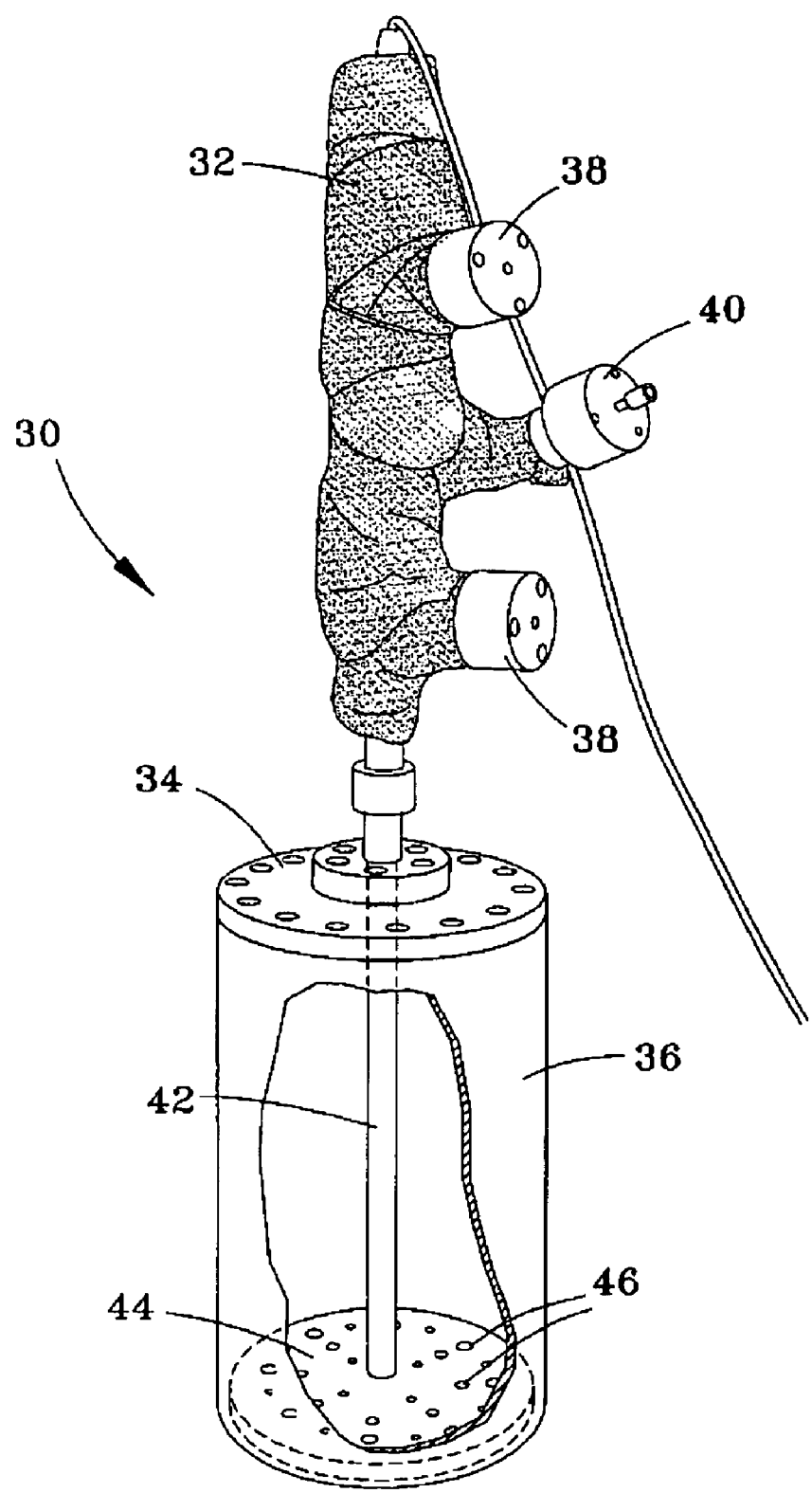
FIG. 3 represents a chemical vapor deposition apparatus suitable for depositing the coating systems of FIGS. 1 and 2.

In an investigation leading to this invention, a barrier layer 16 of tantala and an overlying platinum layer 18 were deposited on the interior surface of a 316 stainless steel tube by CVD using an apparatus 30 represented in FIG. 3. The tantala barrier layer 16 was deposited to a thickness of about 0.00003 inch (about 1000 nm) using tantalum (V) ethoxide ($Ta(OC_2H_5)_5$) as the chemical precursor and using the following deposition parameters: deposition temperature of about 425° C., deposition pressure of about 100 mtorr, and a duration of about 100 minutes. The platinum layer 18 was deposited using platinum (II) 2,4-Pentanedionate (Pt ($C_5H_7O_2)_2$ as the chemical precursor, and using the following deposition parameters: deposition temperature of about 300° C., deposition pressure of about 760 mtorr, and a duration of about 60 minutes. The platinum layer 18 was too thin to be detected scanning electron microscopy, but was estimated to have a thickness of about 40 nanometers.

An important requirement for CVD processes suitable for depositing the coating layers 16 and 18 of this invention is that the precursor material, which is typically either a solid or liquid metallic organic compound at room temperature, must be in the gaseous state by the time it reaches the component wall 12 on which the coating 14 is to be deposited. The evaporation of the precursor material must not take place within line-of-sight to the wall 12 because the volatile evaporation process may produce liquid 'spits' on the wall 12, adversely affecting the coating surface. For this reason, a common practice with MOCVD (metallic organic CVD) reactors has been to use an external evaporation cell to evaporate the precursor material, necessitating the use of heated tubing to transport the precursor vapor into the coating chamber containing the component 10. The tubing must be maintained at a temperature above the precursor's boiling point to minimize temperature gradients that may result in vapor condensation, which would reduce reagent flow into the chamber and affect coating quality. To make the connections to the tubing, high temperature, vacuum-tight flange connections are required, adding time to the coating run preparation and consuming gaskets for every coating campaign.

To address the above-noted disadvantages, the apparatus 30 shown in FIG. 3 is configured to have what may be termed a direct evaporation setup. Instead of an external evaporation cell and heated tubing to transport precursor vapor to a coating chamber, the apparatus 30 transports a precursor material at a controlled rate through heated tubing 32 connected to a lid 34 of a coating chamber 36. The heated tubing 32 provides locations for shutoff valves 38 and a system purge valve 40, and extends the time at which the precursor material is at a suitable elevated temperature to inhibit buildup of precursor within the tubing 32 and promote subsequent evaporation of the precursor within the remainder of the apparatus 30. The precursor then passes through the lid 34 of the coating chamber 36 and travels downward through an evaporation tube 42 that preferably extends the full depth of the coating chamber 36, e.g., about thirty inches (about 0.75 m) in one embodiment. The evaporation tube 42 preferably extends through the center of the coating chamber 36, which is heated and thereby provides the heat required to evaporate the precursor within the evaporation tube 42. To slow the rate at which the precursor travels through the evaporation tube 42 and thereby ensure complete evaporation of the precursor, a mesh or fibrous material (not shown) such as steel wool can be placed within the evaporation tube 42. The resulting precursor vapor enters the coating chamber 36 through a manifold 44 located at the lower end of the tube 42. The manifold 44 is shown as having a generally disc-shaped configuration with outlets 46 in its upper face, such that the precursor vapor must flow through two ninety-degree turns before reaching the component 10 suspended above the manifold 44 within the coating chamber 36. This configuration further reduces the likelihood that the precursor will enter the coating chamber 36 in liquid (or solid) form.

In view of the above, the apparatus 30 shown in FIG. 3 provides a number of advantages for depositing the coating layers 16 and 18 of this invention. The apparatus 30 eliminates the need for an external evaporation cell and extensive heated tubing, and therefore is potentially less costly to purchase and maintain. Reductions in coating time are also possible by eliminating the high temperature vacuum-tight flanges required by prior CVD reactors. The in-chamber evaporation tube 42 provides the potential for an improved heat-up rate and more efficient use of expensive precursor material by eliminating the need to flow precursor vapor through extensive heated tubing that typically results in at least moderate amounts of condensation. Substantial improvement in coating uniformity are also possible because of reduced condensation.

While the invention has been described in terms of a preferred embodiment, it is apparent that other forms could be adopted by one skilled in the art. Therefore, the scope of the invention is to be limited only by the following claims.

What is claimed is:

1. A component through which a hydrocarbon fluid flows at a temperature of about 315 to about 425° C., the component comprising a wall and a coating system on a first surface of the wall, the coating system comprising an outermost layer consisting of platinum and a ceramic barrier layer between the outermost layer and the wall, the hydrocarbon fluid contacting and flowing across the outermost layer, the platinum of the outermost layer catalyzing the hydrocarbon fluid to form particles of carbonaceous gum substances suspended within the hydrocarbon fluid, the ceramic barrier layer having a thickness sufficient to inhibit interdiffusion between the outermost layer and the wall, wherein the outermost layer has a thickness of a monolayer up to about 40 nm or the coating system has a thickness of up to about 100 nm.

2. The component according to claim 1, wherein the barrier layer comprises at least one ceramic material chosen from the group consisting of silica and tantala.

3. The component according to claim 1, wherein the barrier layer consists of silica or tantala.

4. The component according to claim 1, wherein the barrier layer consists of silica.

5. The component according to claim 1, wherein the barrier layer consists of tantala.

6. The component according to claim 1, wherein the wall is formed of a metal alloy chosen from the group consisting of iron-base alloys, nickel-base alloys, and chromium-base alloys.

7. The component according to claim 1, wherein the component is a fuel nozzle of a gas turbine engine and the first surface is an interior surface of the fuel nozzle.

8. The component according to claim 1, wherein the component is a swirler of a gas turbine engine and the first surface is an interior surface of the swirler.

9. The component according to claim 1, wherein the component is an oil scavenge line of a gas turbine engine and the first surface is an interior surface of the oil scavenge line.

10. The component according to claim 1, wherein the outermost layer has a thickness of a monolayer up to about 40 nm.

11. The component according to claim 1, wherein the coating system has a thickness of up to about 100 nm.

12. The component according to claim 1, wherein the wall has a second surface oppositely-disposed from the first surface and exposed to an environment at a temperature higher than the hydrocarbon fluid.

13. The component according to claim 12, further comprising a coating system on the second surface of the wall, the coating system comprising an outermost layer of platinum and a ceramic barrier layer between the outermost layer and the wall, the outermost layer being exposed to the environment so as to reflect radiant energy into the environment.

14. A gas turbine engine component installed on a gas turbine engine and through which a hydrocarbon fluid is flowing at a temperature of about 315 to about 425° C., the component comprising a wall and a coating system on a first surface of the wall, the coating system comprising an outermost layer consisting of platinum and a ceramic barrier layer between the outermost layer and the wall, the hydrocarbon fluid contacting and flowing across the outermost layer, the platinum of the outermost layer having a thickness of a monolayer up to about 40 nm and catalyzing the hydrocarbon fluid to form particles of carbonaceous gum substances suspended within the hydrocarbon fluid, the ceramic barrier layer having a thickness of about 300 to about 5000 nm and consisting essentially of silica and/or tantala to inhibit interdiffusion between the outermost layer and the wall.

15. The gas turbine engine component according to claim 14, wherein the barrier layer consists of silica.

16. The gas turbine engine component according to claim 14, wherein the barrier layer consists of tantala.

17. The gas turbine engine component according to claim 14, wherein the component is a fuel nozzle and the first surface is an interior surface of the fuel nozzle.

18. The gas turbine engine component according to claim 14, wherein the component is a swirler and the first surface is an interior surface of the swirler.

19. The gas turbine engine component according to claim 14, wherein the component is an oil scavenge line and the first surface is an interior surface of the oil scavenge line.

20. The gas turbine engine component according to claim 14, wherein the wall has a second surface oppositely-disposed from the first surface and exposed to an environment at a temperature higher than the hydrocarbon fluid, and the component further comprises a coating system on the second surface of the wall, the coating system comprising an outermost layer of platinum and a ceramic barrier layer between the outermost layer and the wall, the outermost layer being exposed to the environment so as to reflect radiant energy into the environment.

* * * * *